(12) United States Patent
Maynollo

(10) Patent No.: US 8,729,659 B2
(45) Date of Patent: May 20, 2014

(54) SEMICONDUCTOR DEVICES AND METHODS OF MANUFACTURE THEREOF

(71) Applicant: Infineon Technologies AG, Neubiberg (DE)

(72) Inventor: Josef Maynollo, Wappingers Falls, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/846,665

(22) Filed: Mar. 18, 2013

(65) Prior Publication Data

US 2013/0221480 A1    Aug. 29, 2013

Related U.S. Application Data

(62) Division of application No. 12/390,021, filed on Feb. 20, 2009, now Pat. No. 8,399,956, which is a division of application No. 11/491,631, filed on Jul. 24, 2006, now Pat. No. 7,498,232.

(51) Int. Cl.
*H01L 29/06* (2006.01)

(52) U.S. Cl.
USPC .................................................. 257/506

(58) Field of Classification Search
None
See application file for complete search history.

(56) References Cited

U.S. PATENT DOCUMENTS

| 6,001,706 | A  | 12/1999 | Tan et al. |
|---|---|---|---|
| 6,482,716 | B1 | 11/2002 | Wohlfahrt |
| 6,639,266 | B1 | 10/2003 | Yates et al. |
| 6,645,851 | B1 | 11/2003 | Ho et al. |
| 7,064,074 | B2 | 6/2006 | van Bentum et al. |
| 2002/0119666 | A1 | 8/2002 | Kim et al. |
| 2002/0123206 | A1 | 9/2002 | Hong et al. |
| 2004/0063306 | A1 | 4/2004 | Takeuchi |
| 2005/0245042 | A1 | 11/2005 | Haupt et al. |
| 2006/0003546 | A1 | 1/2006 | Klipp et al. |
| 2007/0235785 | A1 | 10/2007 | Kahng et al. |
| 2009/0152672 | A1 | 6/2009 | Maynollo |

FOREIGN PATENT DOCUMENTS

| DE | 10323728 A1 | 8/2004 |
|---|---|---|
| DE | 102005009553 B3 | 6/2006 |

*Primary Examiner* — Seahvosh Nikmanesh
(74) *Attorney, Agent, or Firm* — Slater & Matsil, L.L.P.

(57) ABSTRACT

Methods of fabricating semiconductor devices and structures thereof are disclosed. In a preferred embodiment, a method of fabricating a semiconductor device includes providing a workpiece having a plurality of trenches formed therein, forming a liner over the workpiece, and forming a layer of photosensitive material over the liner. The layer of photosensitive material is removed from over the workpiece except from over at least a portion of each of the plurality of trenches. The layer of photosensitive material is partially removed from over the workpiece, leaving a portion of the layer of photosensitive material remaining within a lower portion of the plurality of trenches over the liner.

21 Claims, 9 Drawing Sheets

SEMICONDUCTOR DEVICES AND METHODS OF MANUFACTURE THEREOF

This application is a divisional application of U.S. application Ser. No. 12/390,021, filed on Feb. 20, 2009 and issued as U.S. Pat. No. 8,399,956 on Mar. 19, 2013 which is a divisional application of U.S. application Ser. No. 11/491,631, filed on Jul. 24, 2006 and issued as U.S. Pat. No. 7,498,232 on Mar. 3, 2009, both of which are incorporated herein by reference.

TECHNICAL FIELD

The present invention relates generally to the fabrication of semiconductor devices, and more particularly to the fabrication of trench structures of semiconductor devices.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor substrate or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

In many semiconductor device designs, trenches are formed within a workpiece, and the trenches are filled with various types of materials, depending on the trench structures to be formed. For example, some trench structures comprise transistors or memory devices. Other trench structures comprise isolation regions that provide electrical isolation between active areas or electronic components formed on an integrated circuit. To form isolation regions, trenches are usually formed in a substrate, and the trenches are filled with insulating materials and other fill materials.

Many other types of devices and components of semiconductor devices are formed using trench structures. For example, wordlines and bitlines of many memory devices are often formed using damascene techniques, by etching trenches in an insulating material and backfilling the trenches with conductive liners and conductive fill materials such as copper.

It is important in many semiconductor device designs that same amount of insulating material, liners, or other fill materials be formed within each trench across a surface of a single die or workpiece, in order to insure adequate electrical isolation and/or performance or uniform operating parameters, for example.

Thus, what are needed in the art are improved methods of forming trench structures of semiconductor devices and structures thereof.

SUMMARY OF THE INVENTION

These and other problems are generally solved or circumvented, and technical advantages are generally achieved, by preferred embodiments of the present invention, which provide novel methods of forming trench structures of semiconductor devices and structures thereof.

In accordance with a preferred embodiment of the present invention, a method of fabricating a semiconductor device includes providing a workpiece having a plurality of trenches formed therein, forming a liner over the workpiece, forming a layer of photosensitive material over the liner, and removing the layer of photosensitive material from over the workpiece except from over at least a portion of each of the plurality of trenches. The layer of photosensitive material is partially removed from over the workpiece, leaving a portion of the layer of photosensitive material remaining within a lower portion of the trenches over the liner.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely in the formation of power semiconductor trench cells. The invention may also be applied, however, to the formation of other types of trench structures, such as deep trench (DT) isolation or shallow trench isolation (STI) regions of semiconductor devices, as examples. Embodiments of the present invention may also be used in the fabrication of other trench structures, such as capacitors, memory devices, other types of transistors, conductive lines, and other devices, as examples.

In semiconductor device manufacturing, in many designs of integrated circuits, it is important that devices have uniform dimensions across the surface of a workpiece, for the electrical components to have uniform operating characteristics and parameters. However, it can be difficult to form devices having the same dimensions across a surface of a workpiece in some applications.

Figure 1:
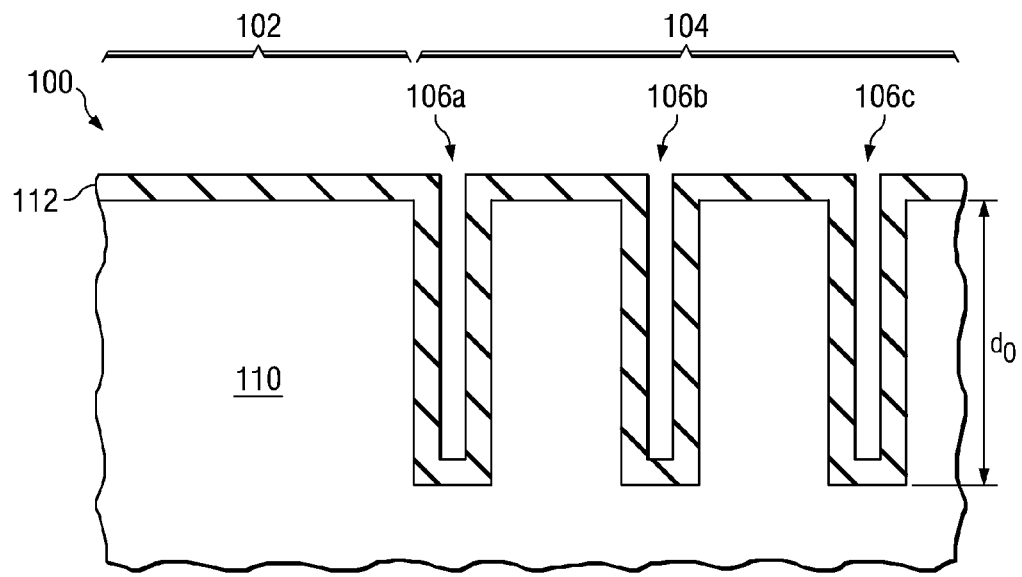
FIGS. 1 through 7 show cross-sectional views of a prior art method of forming a semiconductor device at various stages of manufacturing, wherein non-uniform recesses are formed in an insulating material lining trenches.

With reference now to FIGS. 1 through 7, there is shown a prior art method of forming trench structures 106a, 106b, and 106c of a semiconductor device 100 in cross-sectional views at various stages of manufacturing, wherein non-uniform recesses are formed in a liner 112 formed in the trenches 106a, 106b, and 106c. Referring first to FIG. 1, a workpiece 110 has a first region 102 and a second region 104. The workpiece 110 may comprise a substrate comprised of silicon, for example. A plurality of trenches 106a, 106b, and 106c is formed in the second region 104 of the workpiece 110, whereas no trenches 106a, 106b, or 106c are formed in the first region 102. The plurality of trenches 106a, 106b, and 106c comprise a depth $d_0$ below a top surface of the workpiece 110.

A liner 112 is deposited over the workpiece 110, lining the workpiece 110 top surface and the sidewalls and bottom surface of the trenches 106a, 106b, and 106c in the second region 104. The liner 112 may comprise an oxide such as silicon dioxide, for example. FIG. 1 shows the semiconductor device 100 before a recess process for the liner 112. In a memory device or transistor, the liner 112 may comprise field oxide that is used for isolation of portions of the device, for example, and thus, the amount of recess of the liner 112 in each trench 106a, 106b, and 106c is critical.

Figure 2:
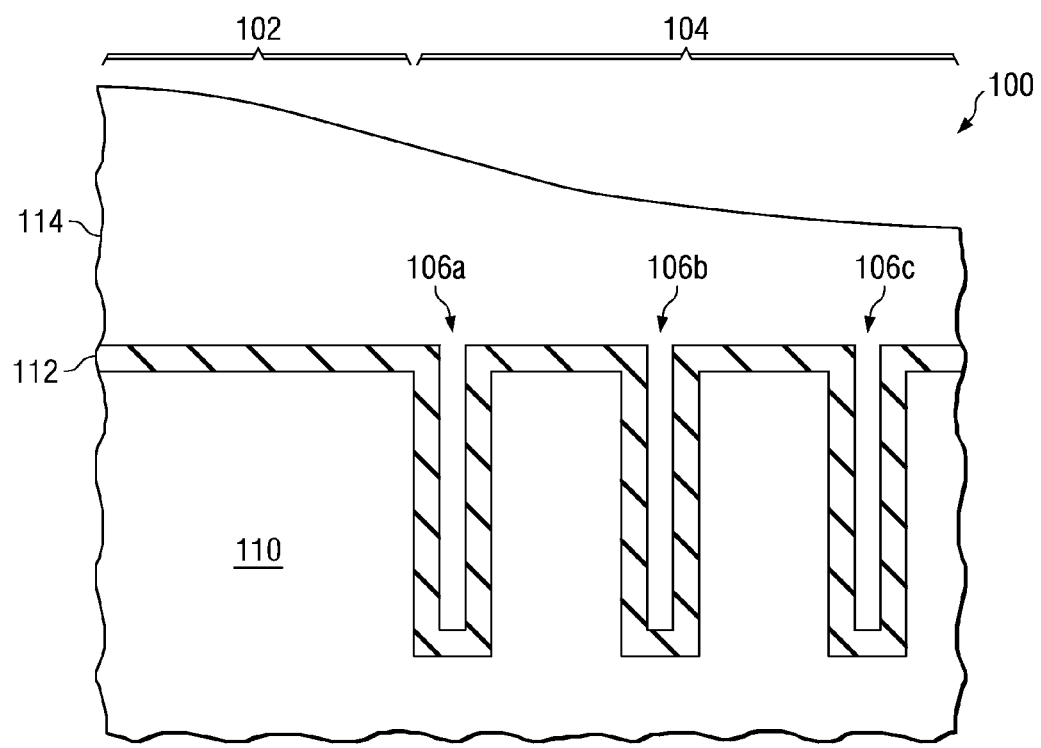

To recess the liner 112 within the trenches 106a, 106b, and 106c, a layer of photosensitive material 114 comprising a positive or negative photoresist, for example, is formed over the workpiece 110, as shown in FIG. 2. The layer of photosensitive material 114 fills the trenches 106a, 106b, and 106c. Because there are trenches 106a, 106b, and 106c formed in the second region 104 and not the first region 102 of the workpiece 110, the layer of photosensitive material 114 has a greater height over the first region 102 of the workpiece 110 than over the second region 104 of the workpiece 110, as shown, due to the filling of the trenches 106a, 106b, and 106c with the layer of photosensitive material 114 in the second region 104. The farther away from the first region 102, the lower the height of the layer of photosensitive material 114 in the second region 104 is, because more of the layer of photosensitive material 114 fills the underlying trenches 106a, 106b, and 106c, for example. The difference in the thickness or height of the layer of photosensitive material 114 in the first region 102 and the second region 104 is often unavoidable and may be due to the spin-on process used to deposit the layer of photosensitive material 114, for example.

Figure 3:
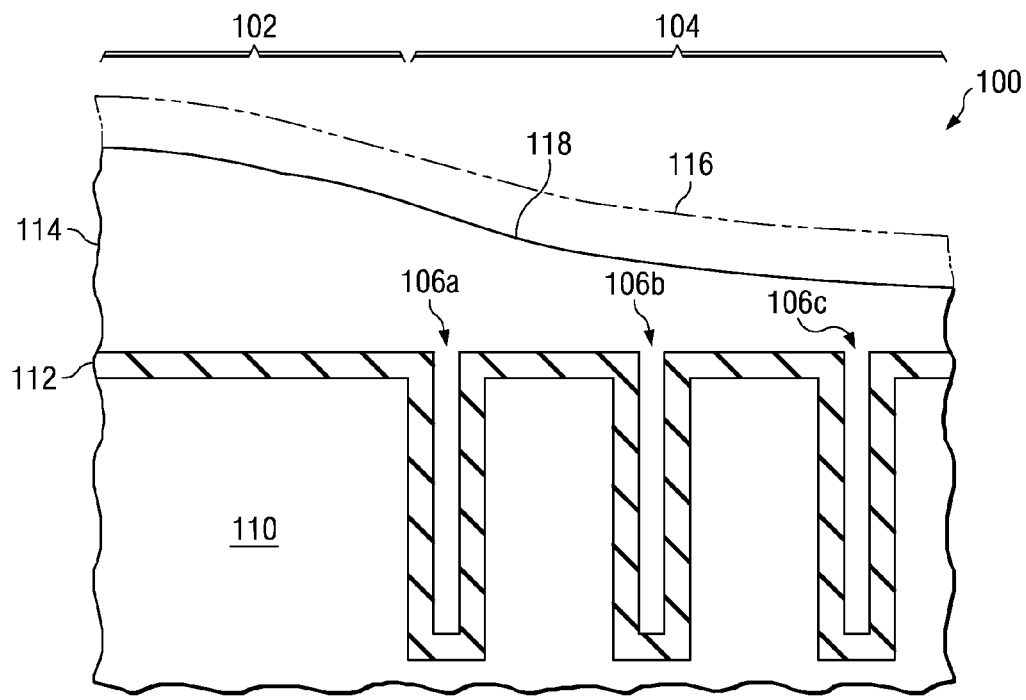

In the prior art method shown, an etch process is used to remove a portion of the layer of photosensitive material 114 from over the workpiece 110, as shown in FIG. 3. The layer of photosensitive material 114 is gradually etched back until the desired recess depth of the layer of photosensitive material 114 within the trenches 106a, 106b, and 106c is achieved, as shown in FIGS. 3, 4, 5, and 6.

At the start of the etch process, the layer of photosensitive material 114 has a first height 116, as shown in phantom in FIG. 3. After the etch process is continued for a period of time, the layer of photosensitive material 114 has a second height 118. The etch process typically comprises an isotropic, e.g., non-directionally biased etch process, resulting in an even removal of the layer of photosensitive material 114 as the etch process proceeds, as shown.

Figure 4:
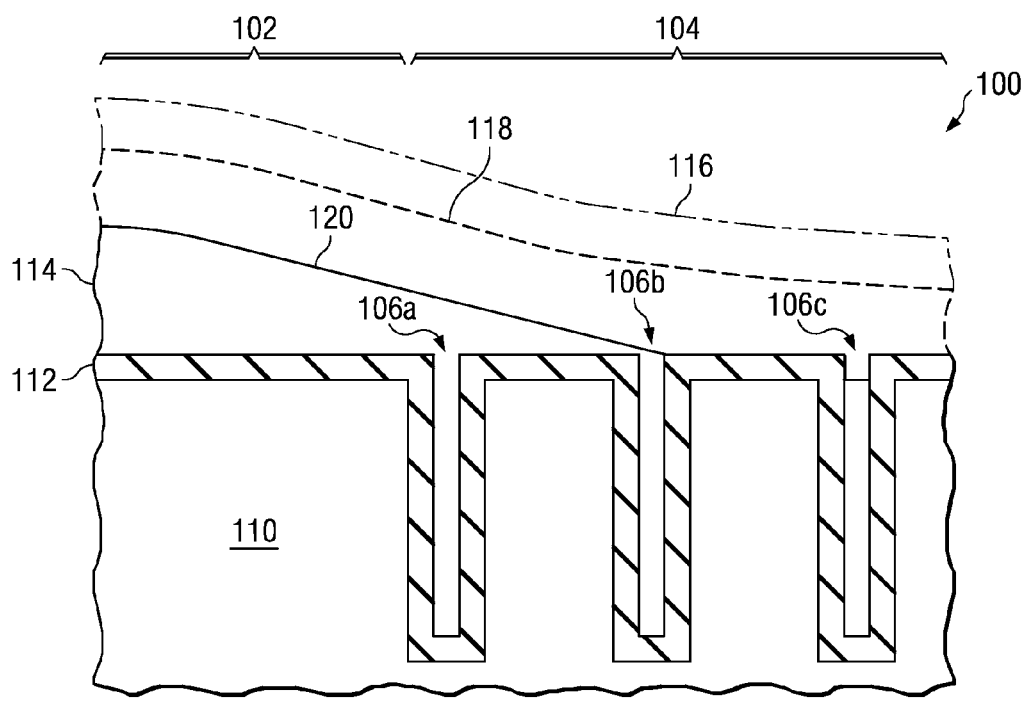

Referring next to FIG. 4, as the etch process continues, more of the layer of photosensitive material 114 is removed. After the etch process is continued for an additional period of time, the layer of photosensitive material 114 has a third height 120. Because the height of the layer of photosensitive material 114 was initially less in the second region 104 than in the first region 102, a portion of the layer of photosensitive material 114 has begun to be etched away from the trenches, as shown in trench 106c.

Figure 5:
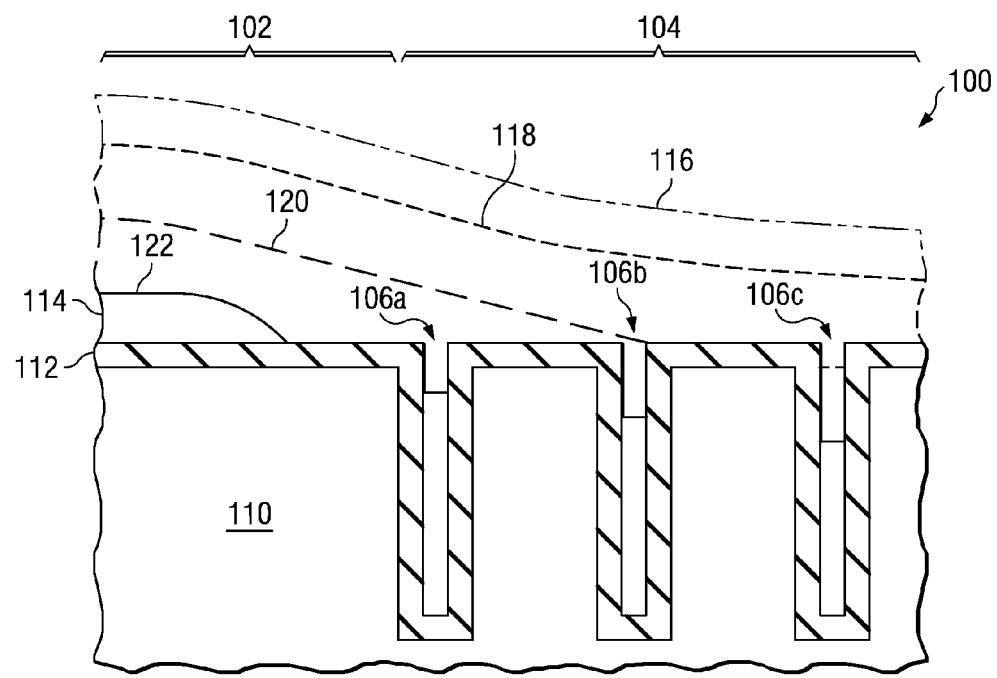

After an additional period of time for the etch process, the layer of photosensitive material 114 has a fourth height 122, as shown in FIG. 5. The layer of photosensitive material 114 has begun to be etched away from all of the trenches 106a, 106b, and 106c, but a portion of the bulk layer of photosensitive material 114 over the top surface of the workpiece 110 in the first region 102 still remains.

Figure 6:
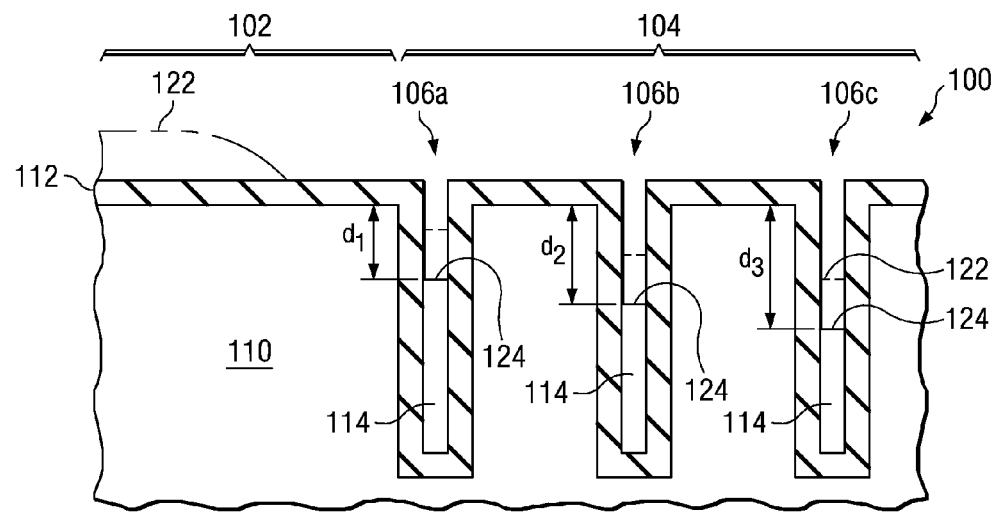

The etch process is further continued, and the layer of photosensitive material 114 has a fifth height 124 at the end of the etch process, as shown in FIG. 6. At this point, all of the bulk photosensitive material 114 has been removed from over the top surface of the workpiece 110 in the first region 102. A portion of the layer of photosensitive material 114 is left remaining in the lower portion of each of the trenches 106a, 106b, and 106c in the second region 104 of the workpiece 110.

Figure 7:
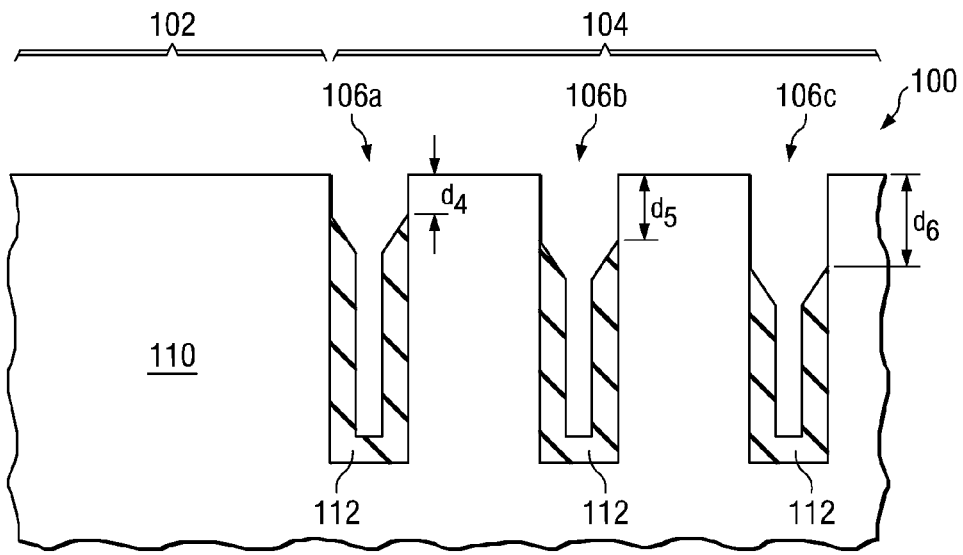

A disadvantage of the prior art method shown in FIGS. 1 through 7 is that because the layer of photosensitive material 114 has a greater height in the first region 102 than in the second region 104 at the start of the etch process, the depth $d_1$ of trench 106a below a top surface of the workpiece 110 is less than the depths $d_2$ and $d_3$ below the top surface of the workpiece 110 for trenches 106b and 106c, respectively, as shown in FIG. 6. Likewise, depth $d_2$ of trench 106b is less than depth $d_3$ of trench 106c. Therefore, when the layer of photosensitive material 114 is used as a mask to remove or etch away a portion of the liner 112 from the top surface of the workpiece 110 and from a top portion of the trenches 106a, 106b, and 106c, the liner 112 has different depths $d_4$, $d_5$, and $d_6$ below the top surface of the workpiece 110 in each of the trenches 106a, 106b, and 106c, respectively, as shown in FIG. 7. Thus, when processing of the semiconductor device 100 is continued, devices formed in trenches 106c will have significantly different properties and operating parameters than trenches 106a and 106b, resulting in unpredictable device performance and possibly even in device failures.

The prior art method of recessing the liner 112 shown in FIGS. 1 through 7 may result in a variation in recess depth between a trench 106a having depth $d_4$ and a trench 106c having a depth $d_6$ below the top surface of the workpiece 110 of about 300 nm, which is unacceptable for device performance. For example, devices formed in the peripheral regions, e.g., at the edges of the second region 104 at trench 106c, may have to be treated as dummy devices, resulting in wasted real estate on the semiconductor device 100.

In the prior art recess method shown in FIGS. 1 through 7, all of the thickness variations of the layer of photosensitive material 114 as deposited are directly transformed to a non-uniformity of the recess depth of the layer of photosensitive material 114, and also to the recessed liner 112 left remaining within the trenches 106a, 106b, and 106c after the etch process. This is particularly a problem for semiconductor devices 100 having dense arrays of trenches 106a, 106b, and 106c, because the thickness of the layer of photosensitive material 114 is reduced at the transition regions from regions such as first region 102 that have no trenches to regions such as second region 104 having many trenches 106a, 106b, and 106c.

Furthermore, in some applications, it may be desirable to leave some areas of the workpiece 110 completely coated with the layer of photosensitive material, e.g., to leave a portion of the liner 112 in some regions of the workpiece 110 (not shown). In such applications, when utilizing the prior art recess method shown, an additional layer of photosensitive material would be required (not shown). For example, an additional layer of photosensitive material would need to be deposited over the workpiece 110 and patterned using an additional lithography mask, increasing costs and the number of manufacturing steps.

Embodiments of the present invention achieve technical advantages by providing novel methods of manufacturing semiconductor devices, wherein trench structures having elements with the same dimensions across a workpiece are formed. Before etching away portions of a layer of photosensitive material, a reverse mask comprising an inverted image of the plurality of trenches is used to pattern the layer of photosensitive material. Improved control over photosensitive material recess depth in the manufacturing process of semiconductor devices within trenches is achieved, to be described further herein.

FIGS. 8 through 15 show cross-sectional views of a method of forming a semiconductor device at various stages of manufacturing in accordance with a preferred embodiment of the present invention, wherein uniform recesses are formed in a liner of a plurality of trenches. Like numerals are used for the elements as were used in the previous figures.

Figure 8:
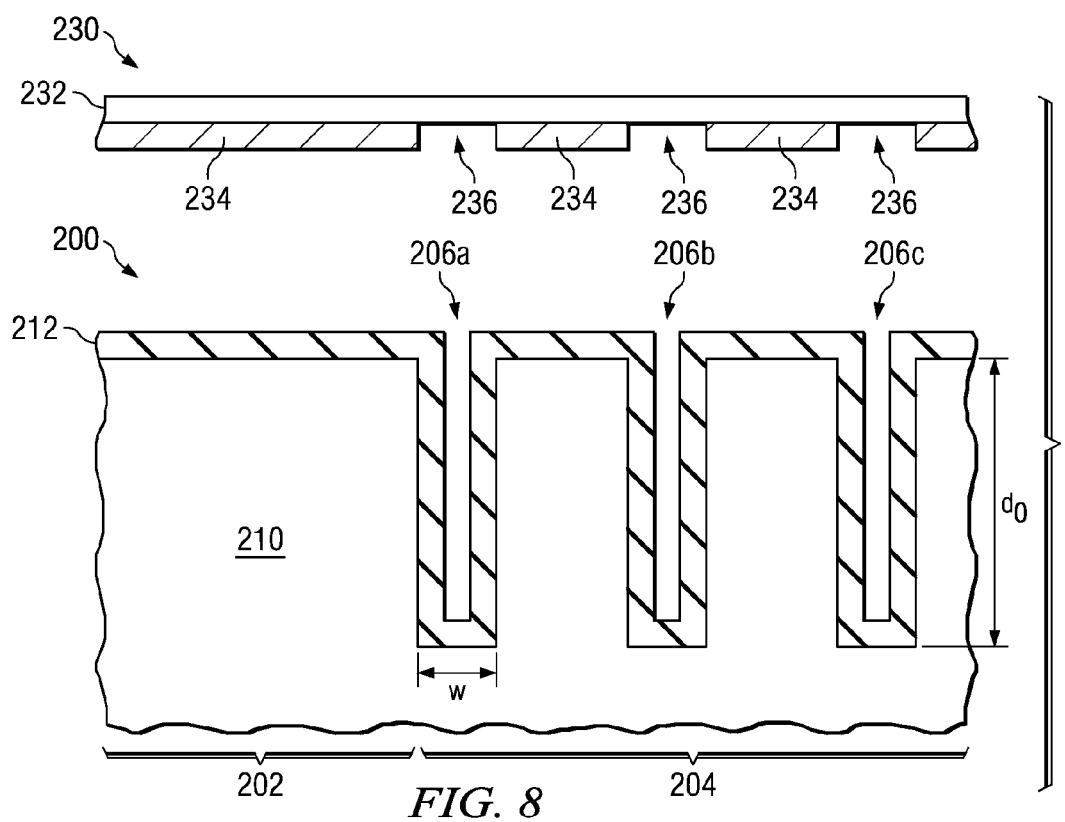
FIGS. 8 through 15 show cross-sectional views of a method of forming a semiconductor device at various stages of manufacturing in accordance with a preferred embodiment of the present invention, wherein uniform recesses are formed in a liner of a plurality of trenches.

Referring next to FIG. 8, first, a workpiece 210 is provided. The workpiece 210 may include a semiconductor substrate comprising silicon or other semiconductor materials covered by an insulating layer, for example. The workpiece 210 may also include other active components or circuits, not shown. The workpiece 210 may comprise silicon oxide over single-crystal silicon, for example. The workpiece 210 may include other conductive layers or other semiconductor elements, e.g., transistors, diodes, capacitors, etc., not shown. Compound semiconductors, GaAs, InP, Si/Ge, or SiC, as examples, may be used in place of silicon. The workpiece 210 may also comprise bulk Si, SiGe, Ge, SiC, or a silicon-on-insulator (SOI) substrate, as examples. The workpiece 210 may include a pad nitride and/or pad oxide formed at a top surface thereof, for example, not shown.

Trenches 206a, 206b, and 206c are formed in a second region 204 of the workpiece 210, but not in a first region 202 of the workpiece 210, as shown in FIG. 8. The second region 204 is also referred to herein as a trench array region, for example. The trenches 206a, 206b, and 206c are preferably formed using lithography, e.g., by depositing a layer of photosensitive material (not shown) over the workpiece 210, patterning the layer of photosensitive material using a first lithography mask 230, and using the layer of photosensitive material as a mask while portions of the workpiece 210 are etched away, for example. The etch process to form the trenches 206a, 206b, and 206c may comprise a dry etch etch process, a reactive ion etch (RIE) process, or other type of etch process, as examples.

The first lithography mask 230 may comprise an opaque material 234 such as chrome attached or bonded to a transparent material 232, such as quartz, as shown. Alternatively, the materials 234 and 232 of the first lithography mask 230 may comprise other materials, for example. The opaque material 234 may be patterned with a pattern for a plurality of trenches 236, as shown. The pattern for the plurality of trenches 236 is transferred to the workpiece 210 to form the trenches 206a, 206b, and 206c, by exposing the layer of photosensitive material (not shown) to light or energy through the lithography mask 230, for example. The layer of photosensitive material is then developed, and exposed portions of the layer of photosensitive material are then removed from the workpiece 210. The layer of photosensitive material is then used as a mask while exposed portions of the liner 212 are etched away in an etch process.

A first lithography mask 230 comprising a binary mask is shown in FIG. 8; alternatively, the first lithography mask 230 may comprise a binary mask, a phase-shifting mask, an alternating phase-shifting mask, or combinations thereof, as examples, although other types of masks 230 may also be used.

Figure 16:
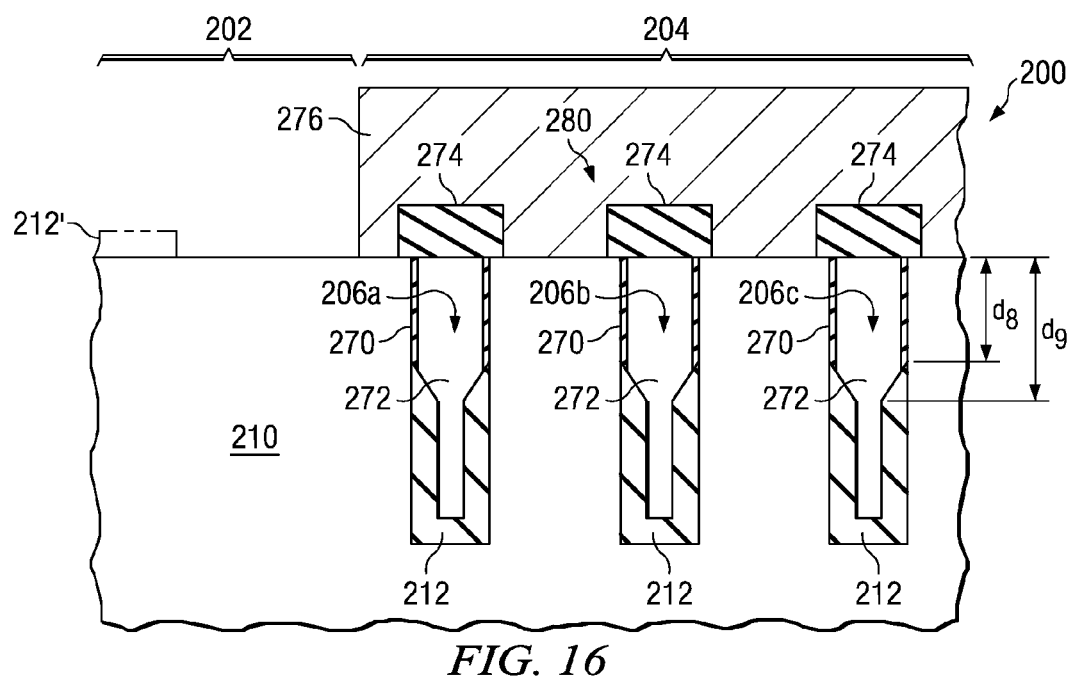
FIG. 16 shows a cross-sectional view of a semiconductor device manufactured using an embodiment of the present invention, wherein the novel trench structures formed comprise power semiconductor trench cells.

The trenches 206a, 206b, and 206c may comprise a width w of about 20 nm to several μm, for example, although the trench width w may comprise other dimensions. The trenches 208 may vary in size and shape across a workpiece 210 (not shown), depending on the application. Some trenches 206a, 206b, and 206c may comprise a width w comprising about 50% greater than a minimum feature size (e.g., 1.5×the minimum feature size) of the semiconductor device 200 and lithography system used to pattern the trenches 206a, 206b, and 206c, for example. The width w of the trenches 206a, 206b, and 206c may comprise about 50 nm for a 32 nm ground rule design, or about 100 nm for a 65 nm ground rule design, as examples. Alternatively, the trenches 206a, 206b, and 206c may comprise a width w that is larger than 50% greater than the minimum feature size for example. The trenches 206a, 206b, and 206c may comprise a depth $d_0$ from the top surface of the workpiece 210 of about 200 to 500 nm in some applications, although the depth $d_0$ may also comprise about 0.2 to 10 μm or greater, for example. The trenches 206a, 206b, and 206c may comprise a length of up to about several millimeters, e.g., in a power semiconductor trench cell layout, as shown in FIG. 16, for example, wherein the trenches 206a, 206b, and 206c are interconnected, forming comb-like structures, to be described further herein.

Preferably a plurality of trenches 206a, 206b, and 206c, e.g., two or more trenches 206a and 206b, are formed in the workpiece 210. The plurality of trenches 206a, 206b, and 206c may comprise a plurality of round, elliptical, square, or rectangular shaped trenches 206a, 206b, and 206c, for example. Alternatively, the plurality of trenches 206a, 206b, and 206c may comprise other shapes. Each of the plurality of trenches 206a, 206b, and 206c comprises sidewalls, a bottom surface, a lower portion, and an upper portion.

The plurality of trenches 206a, 206b, and 206c may comprise substantially vertical sidewalls, as shown. Alternatively, the plurality of trenches 206a, 206b, and 206c may comprise sidewalls that taper inwardly and downwardly, being wider at the top than at the bottom, or they may be wider at the bottom than at the top, not shown.

Next, a deposition process is used to deposit a first liner 212 on the top surface of the workpiece 210 and on the sidewalls and bottom surface of the trenches 206a, 206b, and 206c formed within the workpiece 210, as shown in FIG. 8. The first liner 212 is also referred to herein as a liner, for example. The first liner 212 may comprise an insulating material, a conductive material, a semiconductive material, or multiple layers or combinations thereof, for example. In some embodiments, the first liner 212 may comprise a nitride material or an oxide material, as examples, although the first liner 212 may also comprise other materials. The first liner 212 preferably comprises a thickness sufficient to leave a space within the trenches 206a, 206b, and 206c for the formation of a layer of photosensitive material therein. For example, the first liner 212 may comprise a thickness of several nm, or other dimensions. The first liner 212 may also be formed by an oxidation or nitridation process, although alternatively, the first liner 212 may be formed using other methods.

The first liner 212 is preferably substantially conformal in some embodiments, and preferably completely and evenly covers the top surface of the workpiece 210 and the sidewalls and bottom surfaces of the trenches 206a, 206b, and 206c formed in the workpiece 210. The liner 212 may comprise a conformal material having substantially the same thickness across the surface of the workpiece 210, for example, as shown. In other embodiments (not shown), the first liner 212 may be non-conformal, for example.

Figure 9:
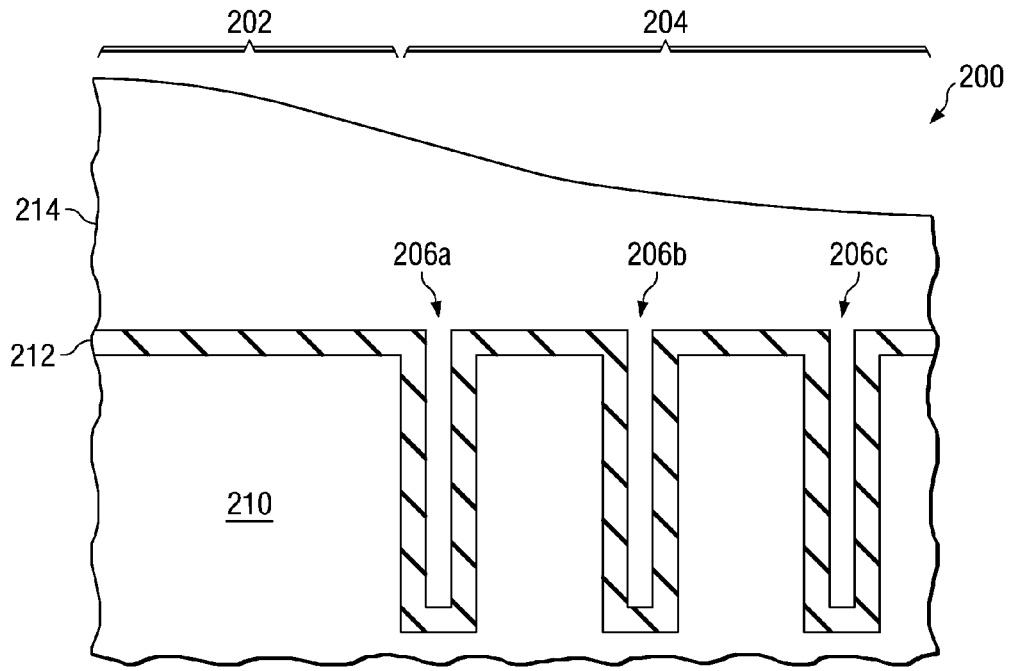

A layer of photosensitive material 214 is formed over the liner 212, as shown in FIG. 9. The layer of photosensitive material 214 preferably fills the plurality of trenches 206a, 206b, and 206c, as shown. The layer of photosensitive material 214 preferably has a height of about 500 nm or greater over the top surface of the liner 212, for example, although the layer of photosensitive material may also comprise other dimensions. The layer of photosensitive material 214 may have a greater height over the first region 202 than over the second region 204 of the workpiece 210, due to the presence of the plurality of trenches 206a, 206b, and 206c, as shown. The layer of photosensitive material 214 may have a greater height in the second region 204 proximate the first region 202 than farther away from the first region 202, as shown.

Figure 10:
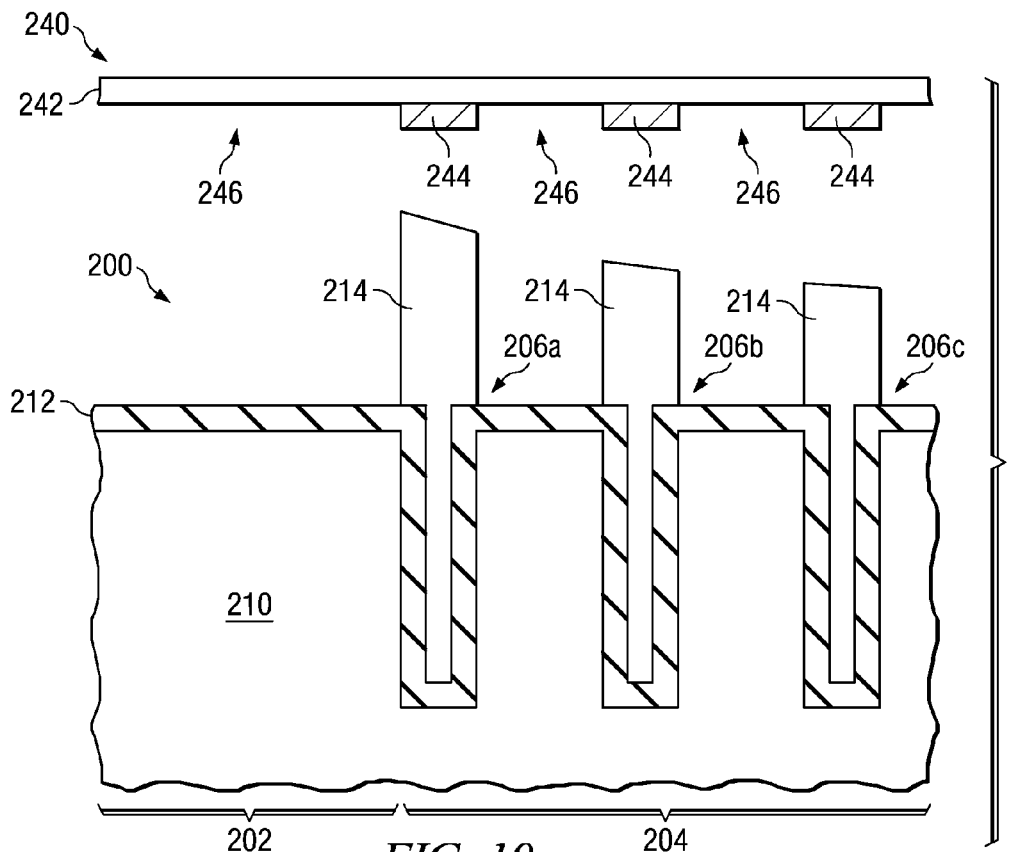

Next, a second lithography mask 240 is provided, as shown in FIG. 10. The second lithography mask 240 preferably comprises a reverse image or pattern of the first lithography mask 230, in one embodiment. For example, the second lithography mask 240 may be adapted to allow light or energy to pass through the transparent patterns 246 to expose the layer of photosensitive material 214 in areas other than over at least a portion of the trenches 206a, 206b, and 206c, whereas the first lithography mask 230 (see FIG. 8) allows light or energy to pass through transparent regions 236 to form the trenches 206a, 206b, and 206c. Transparent regions 246 of the second mask 240 are a reverse image of the transparent regions 236 of the first lithography mask 230, for example.

The second lithography mask 240 may comprise an opaque material 244 such as chrome attached or bonded to a transparent material 242 such as quartz, as shown. Materials 244 and 242 may alternatively comprise other materials, for example. The opaque material 244 may be patterned with a reverse pattern for the plurality of trenches 236, as shown. The reverse pattern for the plurality of trenches 236 is transferred to the workpiece 210 by exposing the layer of photosensitive material 214 to light or energy through the mask 240. The layer of photosensitive material 214 is then developed, and the layer of photosensitive material 214 is removed from over portions of the workpiece 210 other than over at least portions of the trenches 206a, 206b, and 206c, for example.

A second lithography mask 240 comprising a binary mask is shown in FIG. 10; alternatively, the second lithography mask 240 may comprise a binary mask, a phase-shifting mask, an alternating phase-shifting mask, or combinations thereof, as examples, although other types of masks 240 may also be used.

Figure 11:
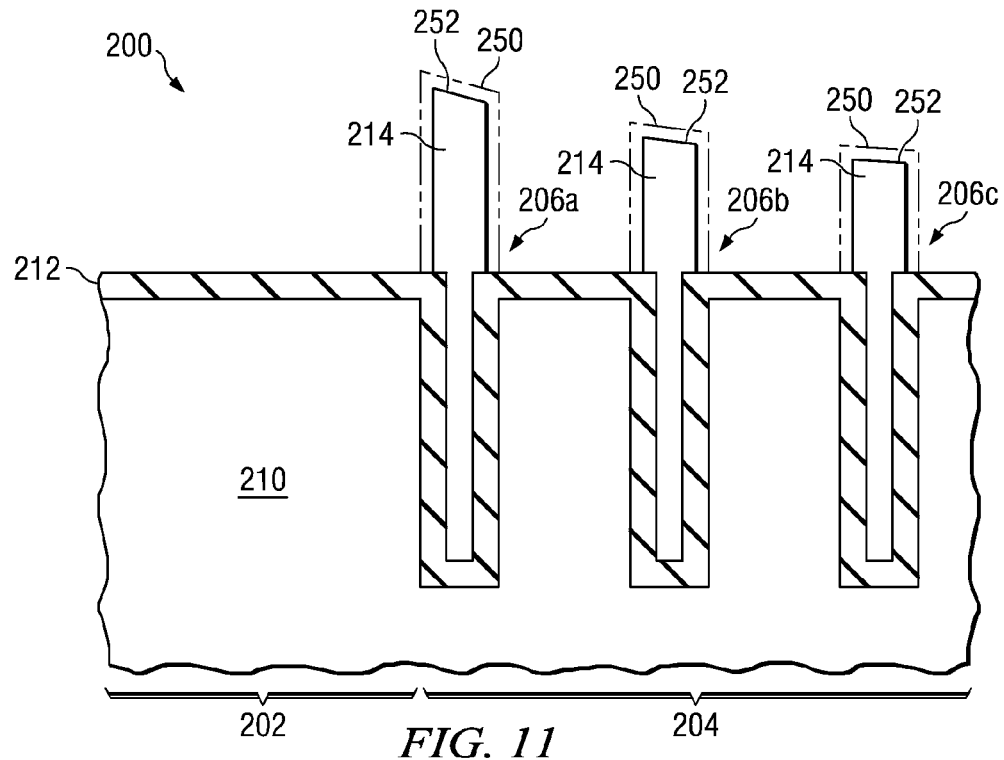
Figure 12:
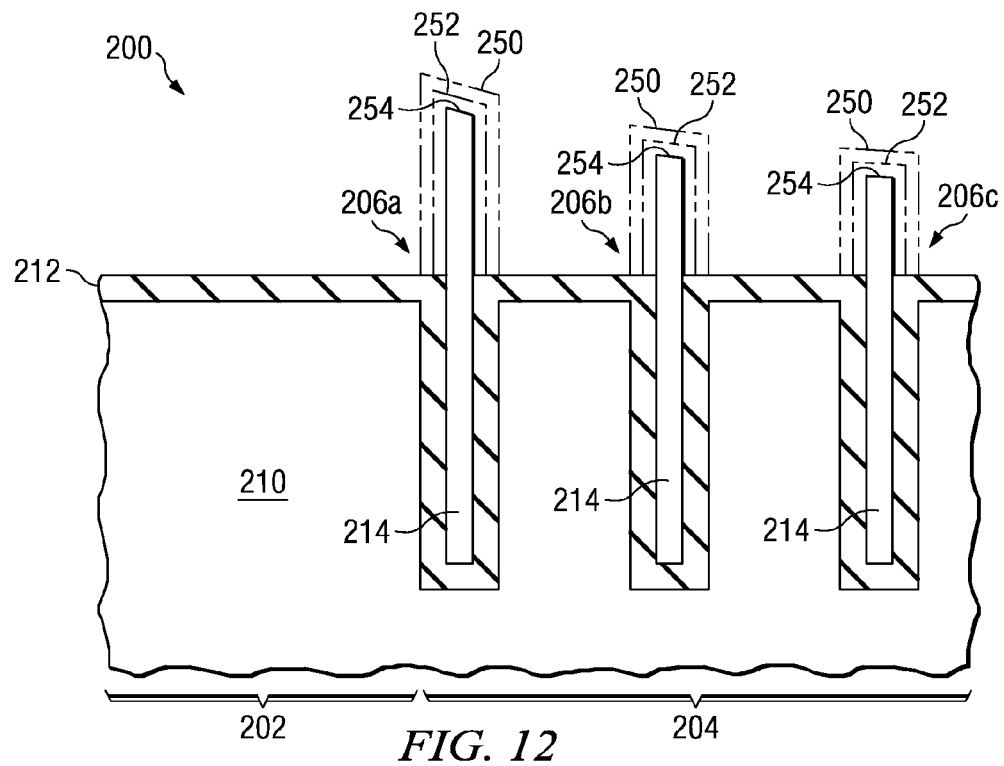

After the layer of photosensitive material 214 is patterned using the second lithography mask 240, as shown in FIG. 10, forming islands of the photosensitive material 214 over the trenches 206a, 206b, and 206c, or forming resist features in the layer of photosensitive material 214, for example, then the workpiece 210 is exposed to an etch process to bi-directionally, e.g., both laterally and vertically etch away the layer of photosensitive material 214, as shown in FIG. 11. The etch process preferably comprises an isotropic etch process in accordance with preferred embodiments of the present invention, for example. The etch process is adapted to etch the photosensitive material 214 but not the liner 212, for example.

At the beginning of the etch process, the layer of photosensitive material 214 comprises a height 250, and after the etch process has continued for a period of time, the height of the layer of photosensitive material 214 comprises 252, as shown in phantom in FIG. 11. The top surface of the layer of photosensitive material 214 is preferably reduced by the same amount that the sidewalls of the layer of photosensitive material 214 are laterally etched, as shown in FIG. 11, e.g., using an isotropic etch process. The etch process is continued, reducing the height and width of the layer of photosensitive material 214 further, to a height 254 shown in FIG. 12.

Note that at the point in the etch process shown at 254, the edge of the layer of photosensitive material 214 has reached the edge of the trench 206a, 206b, and 206c opening. At this point 254, the recess process begins to etch into the depth of the trenches 206a, 206b, and 206c. However, the starting point that the etching begins to etch material 214 in the trench 206a, 206b, and 206c openings (e.g., below the top surface of the workpiece 210) is not dependent on the thickness of the layer of photosensitive material 214, but rather, advantageously, is dependent on the accuracy of the photosensitive material 214 placement, i.e., by overlay and critical dimension (CD) control of the alignment of the second lithography mask 240, for example, in accordance with embodiments of the present invention.

Figure 13:
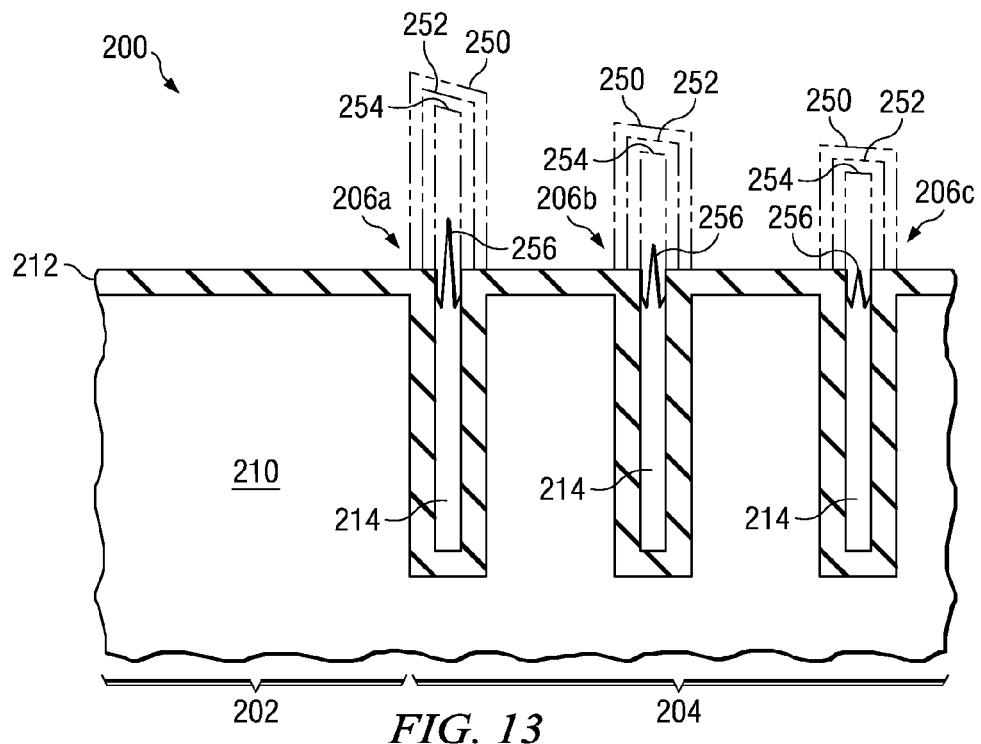

The etch process is continued, reducing the height and width of the layer of photosensitive material 214 even further, as shown in FIG. 13 at height 256. Note that while the layer of photosensitive material 214 initially has a greater height over trench 206a than trench 206c, by this point in the etch process, the layer of photosensitive material 214 is reduced laterally to thin peaks that reside over each of the trenches 206a, 206b, and 206c.

Figure 14:
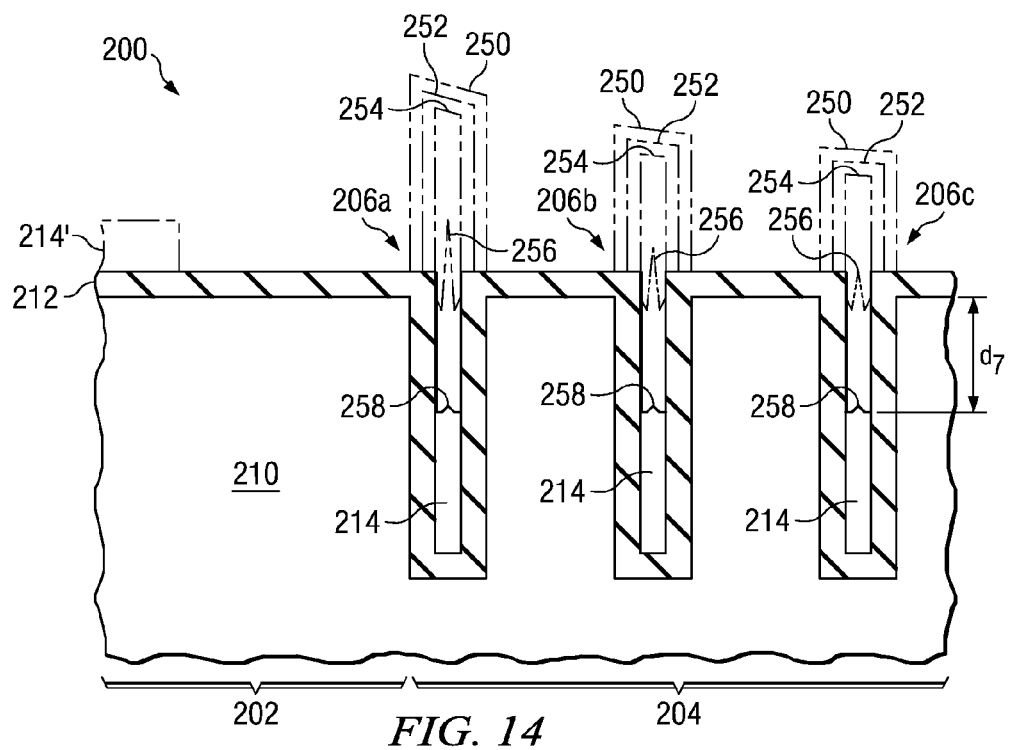

Because the peaks are thin in a lateral direction, as the isotropic etch process continues, the thin peaks are laterally etched away, as shown in FIG. 14, so that the resulting layer of photosensitive material 214 having a height 258 left residing in the trenches 206a, 206b, 206c comprises substantially the same dimension $d_7$ or depth beneath the top surface of the workpiece 210 for each of the plurality of trenches 206a, 206b, and 206c. The dimension $d_7$ preferably comprises about 100 nm in some embodiments, and more preferably comprises about 500 nm or less in other embodiments, as examples, although alternatively, the dimension $d_7$ may comprise other values.

Figure 15:
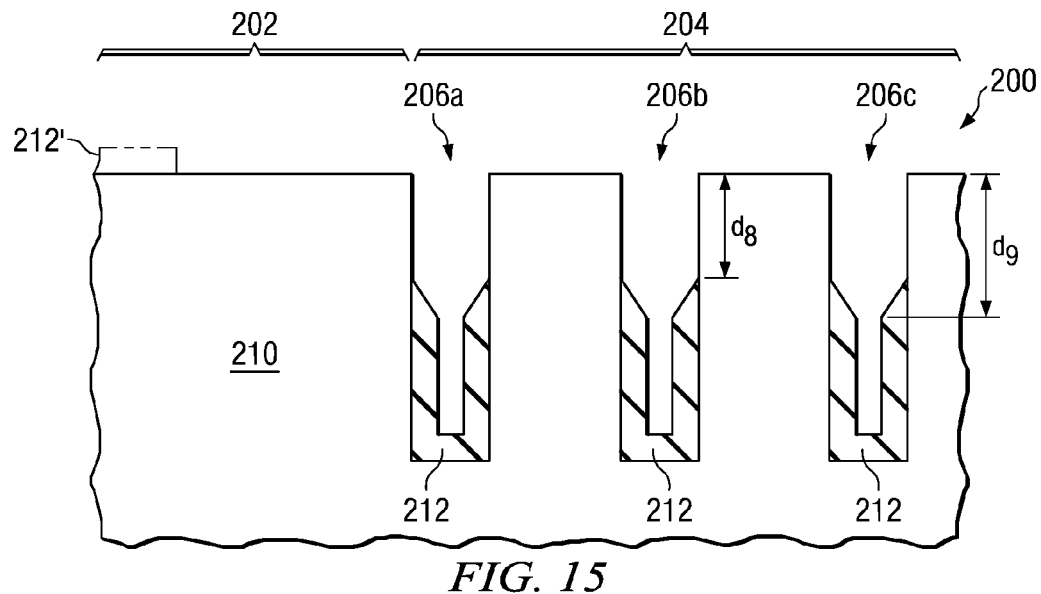

After partially removing the layer of photosensitive material 214 from over the workpiece 210, leaving a portion of the layer of photosensitive material 214 remaining within the lower portion of the plurality of trenches 206a, 206b, and 206c over the liner 212, the layer of photosensitive material 214 is used as a mask to pattern the liner 212, removing the liner 212 from the sidewalls of the upper portion of each of the plurality of trenches 206a, 206b, and 206c. The etch process to recess the liner 212 preferably comprises an etch process adapted to remove the liner 212 but not remove portions of the workpiece 210 or the layer of photosensitive material 214, for example. The layer of photosensitive material 214 is then removed, as shown in FIG. 15.

Note that the liner 212 may be tapered inwardly during the etch process to pattern the liner 212, leaving the top surface of the liner 212 residing at a dimension $d_8$ proximate the trench sidewalls that is greater than the top surface of the liner 212 residing towards an inner portion of the trenches 206a, 206b, and 206c, at a dimension $d_9$. Dimension $d_9$ may be greater than dimension $d_8$ by about 10 nm or greater, although the difference in dimensions $d_9$ and $d_8$ may alternatively comprise other values, for example.

In one embodiment, the layer of photosensitive material 214 may be patterned such that a portion of the layer of photosensitive material 214 remains over the top surface of the workpiece 210 in other regions of the workpiece 210, such as the first region 202, as shown in phantom in FIG. 14 at 214'. This is advantageously an optional embodiment of the present invention. Then, during the etch process to recess the liner 212 within the trenches 206a, 206b, and 206c, the liner 212 in the first region 202 is also patterned to leave the liner 212' in a portion of the first region 202, as shown in phantom in FIG. 15. Thus, in this embodiment, the second lithography mask 240 comprises a reverse pattern for the plurality of trenches in the second region 204 and a pattern for the liner 212' in the first region 202. Advantageously, the liner 212' in the first region 202 is patterned simultaneously with the recessing of the liner 212 in the trenches 206a, 206b, and 206c, avoiding the use of an additional layer of photoresist, an additional lithography mask, and an additional etch process. Note that in this optional embodiment, portions of the liner 212 may also be left remaining in the second region 204 over the top surface of the workpiece 210 if desired, not shown.

In the embodiments shown in FIGS. 8 through 15, preferably the second lithography mask 240 is aligned substantially with the plurality of trenches 206a, 206b, and 206c patterned using the first lithography mask 230. Thus, etching the layer of photosensitive material 214 comprises removing substantially the same amount of the layer of photosensitive material 214 from a first sidewall of each of the plurality of trenches 206a, 206b, and 206c as from a second sidewall opposing the first sidewall of each of the plurality of trenches 206a, 206b, and 206c, for example.

FIG. 16 shows an example of a semiconductor device 200 comprising the trenches 206a, 206b, and 206c that have a recessed first liner 212 patterned in accordance with an embodiment of the present invention. After the first liner 212 is formed in the lower portion of the trenches 212 using the novel etch processes described herein, a second liner 270 is formed in the upper portion of the trenches 212, as shown. The second liner 270 preferably comprises an insulating material such as a layer of silicon dioxide ($SiO_2$) having a thickness of about 4 nm or less, although alternatively, the second liner 270 may also comprise other insulating materials and dimensions. The second liner 270 preferably comprises a gate oxide, in the embodiment shown. The second liner 270 may be formed by a nitridation or oxidation process before the removal of the layer of the photosensitive material 214 shown in FIG. 14, e.g., after the exposed portions of the first liner 212 are etched away, for example. Alternatively, the second liner 270 may be formed using a deposition process and lift-off technique to remove the second liner 270 material from over the layer of photosensitive material 214 during the removal of the layer of photosensitive material 214, for example, not shown. The second liner 270 preferably comprises an insulating material, a conductive material, a semiconductive material, or multiple layers or combinations thereof, as examples.

After the second liner 270 is deposited or formed, a fill material 272 such as a semiconductive material in FIG. 16 is deposited in the trenches 206a, 206b, and 206c, as shown. The fill material 272 may comprise an insulating material, a conductive material, a semiconductive material, or multiple layers or combinations thereof, as examples. The second liner 270 may comprise a portion of or a part of the fill material 272 in some embodiments, for example.

The trenches 206a, 206b, and 206c comprising the first liner 212, second liner 270, and the fill material 272 comprise power transistors in the embodiment shown in FIG. 16, for example. The trench structures may comprise a power semiconductor trench double-diffused metal oxide semiconductor (DMOS) cell 280, for example. The semiconductive fill material 272 may comprise polysilicon that functions as the gates of the transistor. The trench structures 206a, 206b, and 206c may comprise interconnected comb-like structures, for example.

A dielectric material 274 such as boron-doped silicate glass (BSG) may be formed over each trench 206a, 206b, and 206c, and a conductive material 276 may be formed over the dielectric material 274. The conductive material 276 may be electrically coupled to active areas (not shown) in the workpiece 210. Advantageously, the uniformity of the recess depth of the first liner 212 defines the uniformity of the gate length, e.g., proximate the gate oxide 270 in the top portion of each trench 206a, 206b, and 206c. The semiconductor device 200 may include other elements, such as implanted regions in the workpiece 102 and gate contacts, not shown.

Additional conductive material layers and insulating material layers are then formed over the semiconductor device 200 (not shown), and the manufacturing process is continued to complete the fabrication of the semiconductor device 200.

Alternatively, the trench structures 206a, 206b, and 206c may comprise isolation regions formed between active areas formed in the workpiece 210, wherein the active areas may include transistors, complementary metal oxide semiconductor (CMOS) devices, memory devices, logic devices, power devices, capacitors, circuitry components, groups of circuitry components, and/or combinations thereof, as examples, not shown.

The optional portion of the liner 212' that may be left remaining in the first region 202 in accordance with an embodiment of the present invention is shown in phantom in FIG. 16, for example.

Note that isolation structures may be formed comprising that trench structures that comprise STI regions, DT isolation regions, combinations of STI and DT isolation regions, or other types of isolation structures, as examples. For example, the trench structures may comprise STI regions formed in CMOS devices, which use both positive and negative channel devices in complementary configurations. The positive and negative channel devices of CMOS devices are typically referred to as p channel metal oxide semiconductor (PMOS) and n channel metal oxide semiconductor (NMOS) transistors, for example. In a CMOS device, the PMOS transistor is formed in an n well in the workpiece (e.g., a well implanted with n type dopants) and the NMOS transistor is formed in a p well in the workpiece. An STI region comprising the novel trench structures described herein may be formed between the n well and p well of the PMOS transistor and the NMOS transistor, respectively. The STI region may extend within a semiconductor substrate or workpiece by about the depth of the maximum n well and p well doping concentration, e.g., by about 0.2 to 1.0 µm, for example.

Figure 17:
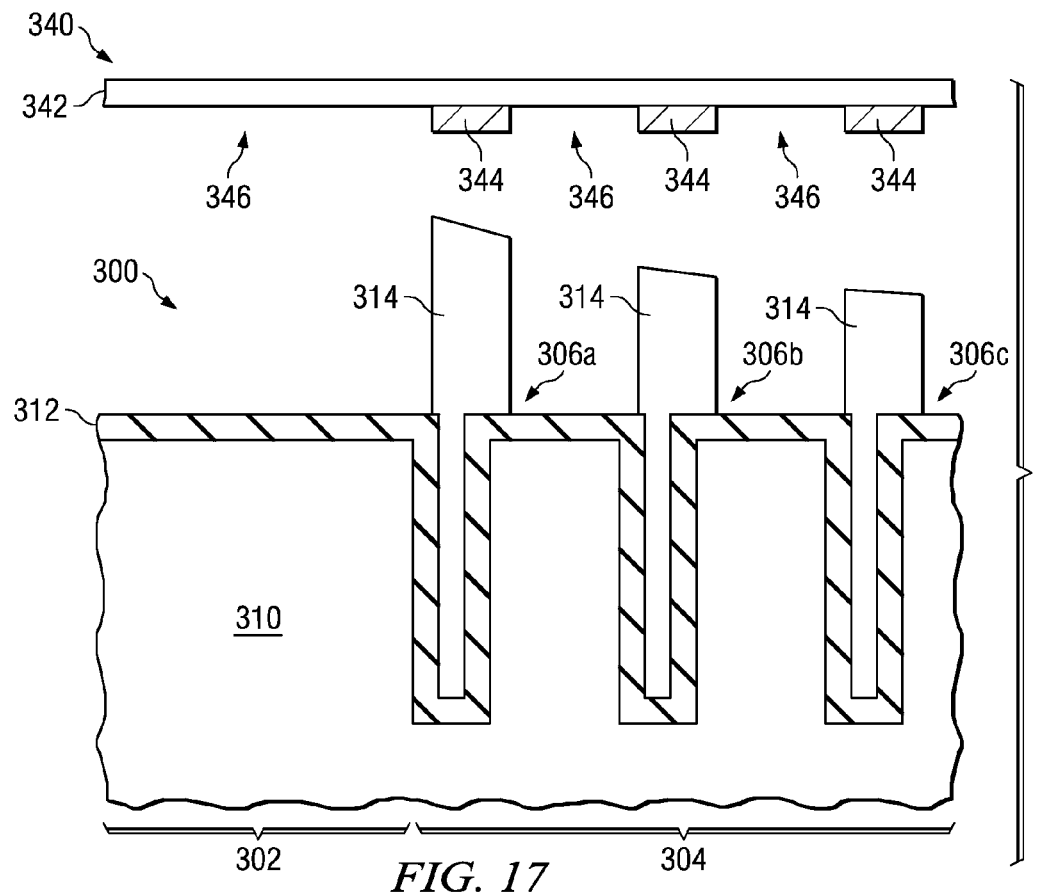
FIGS. 17 and 18 show cross-sectional views of a semiconductor device at various stages of manufacturing in accordance with another preferred embodiment of the present invention, wherein a liner comprises a first dimension on a first sidewall and a second dimension on a second sidewall opposing the first sidewall of each of the plurality of trenches.
Figure 18:
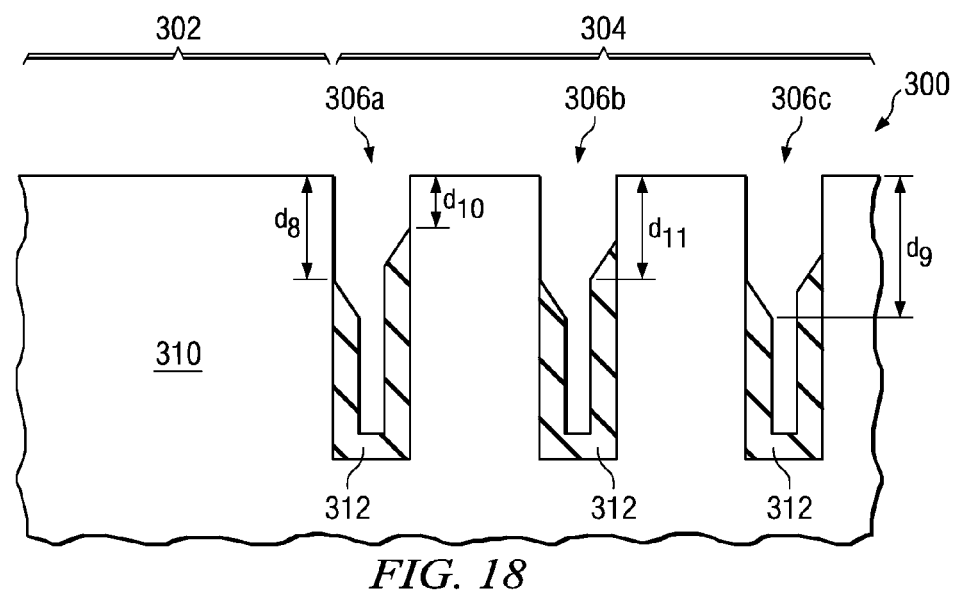

FIGS. 17 and 18 show cross-sectional views of a semiconductor device 300 manufactured using another preferred embodiment of the present invention. Like numerals are used in FIG. 16 for the various elements that were used to describe the previous figures. To avoid repetition, each reference number shown in FIGS. 17 and 18 is not described again in detail herein. Rather, similar materials are preferably used for the various material layers shown as were described for the element numbers in the format "xyz" in FIGS. 8 through 16, where x=2 in FIGS. 8 through 16, x=3 in FIGS. 17 and 18, and "yz" represents numerals indicating the same type of elements as described in the previous figures; e.g., a workpiece 310 in FIGS. 17 and 18 represents a workpiece such as the workpiece 210 described in the FIGS. 8 through 16.

In FIG. 17, the second lithography mask 340 is a reverse image of the first lithography mask (e.g., such as mask 230 shown in FIG. 8) used to pattern the trenches 306a, 306b, and 306c, but the second lithography mask 340 is not aligned exactly with the trenches 306a, 306b, and 306c. This may be intentional as a part of the semiconductor device 300 design, or this may be unintentional due to a slight misalignment of the lithography mask 340, for example.

In this embodiment, the second lithography mask 340 comprises a lithography mask adapted to expose the layer of photosensitive material over portions of the workpiece 310, but not expose the layer of photosensitive material 314 over at least a portion of each of the plurality of trenches 306a, 306b, and 306c. The second lithography mask 340 is preferably not exactly aligned with the plurality of trenches 306a, 306b, and 306c patterned using the first lithography mask (e.g., such as mask 230 shown in FIG. 8). Thus, etching the layer of photosensitive material 314 comprises removing a first amount of the layer of photosensitive material from a first sidewall of each of the plurality of trenches 306a, 306b, and 306c and removing a second amount of the layer of photosensitive material 314 from a second sidewall opposing the first sidewall of each of the plurality of trenches 306a, 306b, and 306c, as shown in FIG. 18 after the layer of photosensitive material 314 is removed.

Thus, after the etch process for the layer of photosensitive material 314, the layer of photosensitive material 314 comprises a first dimension $d_8$ and $d_9$ on a first sidewall (e.g., the left sidewalls) of each of the plurality of trenches 306a, 306b, and 306c and a second dimension $d_{10}$ and $d_{11}$ on a second sidewall (e.g., the right sidewalls) opposing the first sidewall of each of the plurality of trenches 306a, 306b, and 306c. The first dimensions $d_8$ and $d_9$ may comprise zero; for example, as shown in FIGS. 17 and 18. Alternatively, a portion of the liner 312 may be uncovered with the layer of photosensitive material 314 after the etch process to recess the layer of photosensitive material 314 on the left sidewall.

Then, after the recessed layer of photosensitive material 314 is used as a mask to pattern the liner 312, the liner comprises the first dimension $d_8$ and $d_9$ on the first sidewall of each of the plurality of trenches 306a, 306b, and 306c and the second dimension $d_{10}$ and $d_{11}$ on the second sidewall of each of the plurality of trenches 306a, 306b, and 306c, wherein the second dimension $d_{10}$ and $d_{11}$ is different than the first dimension $d_8$ and $d_9$. For example, proximate the sidewall of the trenches 306a, 306b, and 306c, the left sidewalls of the trenches 306a, 306b, and 306c shown in FIG. 18 comprise dimension $d_8$ proximate the left sidewalls beneath the top surface of the workpiece 310 and the right sidewalls comprise dimension $d_{10}$ proximate the right sidewalls beneath the top surface of the workpiece 310 that is greater than dimension $d_8$. Likewise, the dimension $d_9$ closer towards a central region of the trenches 306a, 306b, and 306c of the left sidewalls is greater than dimension $d_{11}$ below the top surface of the workpiece 310 closer to the central region of the trenches 306a, 306b, and 306c.

In the embodiment shown in FIGS. 17 and 18, although the left sidewalls and right sidewalls of the trenches 306a, 306b, and 306c comprise varying dimensions of the liner 312, advantageously, the dimensions of the liner 312 are substantially the same for each of the plurality of trenches 306a, 306b, and 306c on the left and right sidewalls, resulting in a semiconductor device 300 having predictable and uniform dimensions and performance parameters across a surface of the workpiece 310.

Embodiments of the present invention include methods of manufacturing the novel trench structures described herein. Embodiments of the present invention also include semiconductor devices 200 and 300 manufactured in accordance with the methods of forming trench structures described herein, for example. The liners 212 and 312 and the fill materials 270 and 272 formed within the plurality of trenches 206a, 206b, 206c, 306a, 306b, and 306c described herein may comprise transistors, isolation regions, shallow trench isolation regions, deep trench isolation regions, capacitors, memory devices, power transistors, conductive lines (e.g., such as wordlines or bitlines of memory devices, or other conductive features), portions of other electrical devices, and/or combinations thereof, as examples. If the novel trench structures comprise isolation regions, the isolation regions may provide electrical isolation between a plurality of active areas formed within and/or over the workpiece, wherein the plurality of active areas comprise transistors, CMOS devices, memory devices, logic devices, power devices, capacitors, circuitry components, groups of circuitry components, and/or combinations thereof.

Advantages of embodiments of the invention include opening a bulk-deposited layer of photosensitive material 214 and 314 selectively using an inverted trench pattern mask 240 and 340, which avoids the transformation of resist-thickness changes into variations of the trench recess depth, and thus gaining more leverage to control the recess process for the layer of photosensitive material 214 and 314 within the trenches 206a, 206b, 206c, 306a, 306b, and 306c. Removing the thickest top portion of the layer of photosensitive material 214 and 314 in the first regions 202 and 302 simultaneously while recessing the photosensitive material 214 and 314 in the trenches 206a, 206b, 206c, 306a, 306b, and 306c in the second regions 204 and 304 is avoided, eliminating a dependence on resist-thickness variations, particularly at the edge of a trench array region, such as in regions 204 and 304. Thus, the formation of unusable or dummy devices at the edges of trench array regions 204 and 304 is avoided, preventing usable surface area loss of the workpiece 210 and 310.

The recess process of the layer of photosensitive material 214 and 314 into the trenches 206a, 206b, 206c, 306a, 306b, and 306c is triggered and controlled by the lateral dimension of the feature of photosensitive material 214 and 314 over the trenches 206a, 206b, 206c, 306a, 306b, and 306c as well as by the edge-placement of the feature of photosensitive material 214 and 314 relative to an edge of the trenches 206a, 206b, 206c, 306a, 306b, and 306c.

Improved uniformity in the recess depth of the liner 212 and 312 within the trenches 206a, 206b, 206c, 306a, 306b, and 306c is achieved by the novel etch processes and trench structures described herein, which is essential for device 200 and 300 performance in some semiconductor applications, for example. Variations in the liner 212 and 312 recess dimensions for trenches 206a, 206b, 206c, 306a, 306b, and 306c across a workpiece 210 and 310 of about 40 nm or less is achievable using the embodiments of the present invention described herein, for example.

Advantageously, the uniformity of the liner 212 and 312 recess depth is independent of the layer of photosensitive material 214 and 314 thickness deviations in accordance with embodiments of the present invention. Thus, the thickness of the layer of photosensitive material 214 and 314 (e.g., comprising a greater thickness in the first region 202 and 302 than in the second region 204 and 304 of the workpiece 210 and 310) does not influence or control the depth of the recesses formed in the layer of photosensitive material 214 and 314 within the trenches 206a, 206b, 206c, 306a, 306b, and 306c. Therefore, variations of thickness of the layer of photosensitive material 214 and 314 within the trenches 206a, 206b, 206c, 306a, 306b, and 306c are avoided and are no longer a problem, resulting in semiconductor devices 200 and 300 having uniform operating characteristics and parameters across a surface of a workpiece 210 and 310.

Furthermore, the lateral dimensions of the resist features (e.g., the patterned layer of photosensitive material 314 shown in FIG. 17) may be tuned above the trench 306a, 306b, and 306c openings to enable the formation of different depths of photosensitive material 314 on opposing sidewalls of the trenches 306a, 306b, and 306c. The different thicknesses of photosensitive material 314 and the liner 312 on opposing sidewalls of the trenches 306a, 306b, and 306c may be used to compensate for etch signatures in recess depth by adapting the resist feature size accordingly, for example.

In addition, portions of the liner 212' may be left remaining over the top surface of regions of the workpiece, such as in the first region 210, as shown in phantom at 212' in FIGS. 15 and 16, without requiring the use of an additional lithography step, an additional layer of photoresist, and an additional lithography mask, in accordance with an embodiment of the present invention.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a substrate;
   a first trench disposed in the substrate, the first trench comprising first sidewalls, a first bottom surface, and a first lower portion;
   a second trench disposed in the substrate, the second trench comprising second sidewalls, a second bottom surface, and a second lower portion, wherein the first trench and the second trench are disposed in a first region, and wherein no trench is disposed in a second region adjacent to the first region; and
   a first liner disposed only over the first sidewalls of the first lower portion and the first bottom surface of the first trench and a second liner disposed only over the second sidewalls of the second lower portion and the second bottom surface of the second trench, wherein a first distance from the first bottom surface to a first top of the first lower portion is substantially the same as a second distance from the second bottom surface to a second top of the second lower portion, wherein the first liner and the second liner are inwardly tapered, and wherein the first liner is the same as the second liner.

2. The semiconductor device according to claim 1, wherein at least one of the first sidewalls and the second sidewalls are inwardly tapered.

3. The semiconductor device according to claim 1, wherein the first liner and the second liner comprise an insulating material.

4. The semiconductor device according to claim 1, wherein the first liner and the second liner comprise a conductive material.

5. The semiconductor device according to claim 1, wherein the first liner and the second liner comprise multiple layers.

6. The semiconductor device according to claim 1, wherein the first liner and the second liner are substantially conformal.

7. The semiconductor device according to claim 1, wherein the first trench is larger than the second trench.

8. The semiconductor device according to claim 1, wherein at least one of the first sidewalls and the second sidewalls are substantially vertical.

9. The semiconductor device according to claim 1, wherein the first liner and the second liner are inwardly tapered by a difference of about 10 nm or greater.

10. The semiconductor device according to claim 1, wherein the first trench and the second trench each comprise a width that is larger than 50% greater than a minimum feature size.

11. A semiconductor device, comprising:
    a substrate;
    a trench array disposed in the substrate, each trench of the trench array comprises sidewalls, a bottom surface, and a lower portion;
    no trench disposed in a region adjacent to peripheral trenches of the trench array; and
    a liner disposed only over the sidewalls of the lower portion and the bottom surface of the trenches of the trench array, wherein the liner is inwardly tapered.

12. The semiconductor device according to claim 11, wherein the sidewalls of the trenches are inwardly tapered.

13. The semiconductor device according to claim 11, wherein the liner is inwardly tapered by a difference of about 10 nm or greater.

14. The semiconductor device according to claim 11, wherein the liner comprises a conductive material.

15. The semiconductor device according to claim 11, wherein the liner comprises an insulating material.

16. The semiconductor device according to claim 11, wherein the liner comprises a semiconductive material.

17. The semiconductor device according to claim 11, wherein the liner comprises multiple layers.

18. A semiconductor device, comprising:
a substrate;
a trench array disposed in the substrate, each trench of the trench array comprises sidewalls, a bottom surface, and a lower portion;
no trench disposed in a region adjacent to peripheral trenches of the trench array; and
a plurality of liners disposed only over the sidewalls of the lower portion and the bottom surface of the trenches of the trench array, wherein the plurality of liners are inwardly tapered.

19. The semiconductor device according to claim 18, wherein the sidewalls of the trenches are inwardly tapered.

20. The semiconductor device according to claim 18, wherein each trench of the trench array further comprise an upper portion, and wherein a further liner is disposed only over the sidewalls of the upper portion of the trenches of the trench array.

21. A semiconductor device, comprising:
a substrate;
a transistor array disposed in the substrate; and
no transistor disposed in a region adjacent to peripheral transistors of the transistor array, wherein each transistor of the transistor array comprises:
a trench comprising a bottom surface, sidewalls, a lower portion and an upper portion;
a first insulating liner disposed only over the sidewalls of the lower portion and the bottom surface of the trench;
a second insulating liner disposed only over the sidewalls of the upper portion of the trench;
a semiconductive fill material disposed in the trench; and
a cap disposed over trench, the second insulating liner and the semiconductive fill material, wherein the first insulating liner and the second insulating liner are inwardly tapered.

* * * * *